US 6,703,957 B2

(12) United States Patent
Morimoto et al.

(10) Patent No.: US 6,703,957 B2
(45) Date of Patent: Mar. 9, 2004

(54) DIGITAL-TO-ANALOG CONVERTER

(75) Inventors: Yasuo Morimoto, Tokyo (JP); Toshio Kumamoto, Tokyo (JP); Takashi Okuda, Tokyo (JP); Takahiro Miki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/143,878

(22) Filed: May 14, 2002

(65) Prior Publication Data

US 2003/0006922 A1 Jan. 9, 2003

(30) Foreign Application Priority Data

Jun. 29, 2001 (JP) .......................... 2001-199283

(51) Int. Cl.$^7$ .......................... H03M 1/66; H03M 1/82
(52) U.S. Cl. ........................ 341/152; 341/144
(58) Field of Search ................. 341/144, 148, 341/152, 143

(56) References Cited

U.S. PATENT DOCUMENTS

| 3,543,009 | A | * | 11/1970 | Voelcker, Jr. | ............... 341/143 |
| 3,836,908 | A | * | 9/1974 | Hegendorfer | ............... 341/152 |
| 4,868,572 | A | * | 9/1989 | Reiber | ......................... 341/145 |
| 4,947,171 | A | * | 8/1990 | Pfeifer et al. | ............... 341/143 |
| 5,245,345 | A | * | 9/1993 | Kohdada et al. | ........... 341/152 |

FOREIGN PATENT DOCUMENTS

| JP | 2000-269761 | 9/2000 |
| JP | 3102024 | 10/2000 |
| JP | 2001-036409 | 2/2001 |

* cited by examiner

Primary Examiner—Howard L. Williams
(74) Attorney, Agent, or Firm—Burns, Doane, Swecker & Mathis, LLP

(57) ABSTRACT

When forming PDM pulses by a D/A converter in accordance with digital signals, the D/A converter causes at least one of the rising stage and the falling stage of each of the PDM pulses to change stepwise. In addition, when forming PWM pulses by another D/A converter, the D/A converter causes at least one of the rising stage and the falling stage of each of the PWM pulses to change stepwise.

7 Claims, 13 Drawing Sheets

DIGITAL-TO-ANALOG CONVERTER

BACKGROUND OF THE INVENTION

1. Field of the Invention

The present invention relates to a digital-to-analog converter (D/A converter).

2. Prior Art/Related Art

There are many types of D/A converters utilizing PDM and PWM, e.g., delta-sigma D/A converters for voice transmission.

PDM is an abbreviation for pulse-density modulation. In a PDM D/A converter, a data cycle is divided into shorter cycles by means of a higher rate clock. For each clock cycle, an electric potential having either of higher and lower level is output, so that a series of pulses are generated. An input digital bit is represented by the density of the electric potential in one data cycle. The final output analogue signal can be obtained by filtering the series of pulses through an analogue low-pass filter. PDM mechanism is an analogue output mechanism having a characteristic that the output energy has one-to-one relationship with the input data.

Typical PDM mechanism produces a middle level of potential in addition to the binary levels of potential. The period for outputting the middle level of potential is referred to as a reset period. For example, as shown in FIG. 19, the potential is $+V_{ref}$ (higher level) at the first clock cycle, is decreased to $V_{center}$ to indicate a stand-by status at the next clock cycle (reset period), is decreased to $-V_{ref}$ (Lower level) at the further next clock cycle, and is increased to $V_{center}$ to indicate a stand-by status at the next clock cycle (reset period).

Since one-bit delta sigma D/A converters use the oversampling technique, they sometimes produce the outputs being similar to that of the PDM mechanisms.

PWM is an abbreviation for pulse-width modulation. In PWM, as shown in FIG. 20, a data cycle is divided into shorter clock cycles by means of a higher rate clock as similar to PDM, and an electric potential having either higher or lower level is output for each clock cycle. In contrast to PDM, codes are not represented by the density of potential according to PWM. Rather, the period or the number of clock cycles for outputting the higher level of potential during a data cycle varies according to codes. For example, the first data cycle in FIG. 20 represents code "one" since the number of clock cycles for outputting the higher level potential is one. The second data cycle in FIG. 20 represents code "three" since the number of clock cycles for the higher level potential is three.

By virtue of PWM and PDM, the output is limited to have only two or three levels (one among three levels means the reset or stand-by status). Therefore, on the contrary to a multi-valued D/A converter, extraordinarily high accuracy of output can be realized regardless of variation in capabilities of respective elements, and the size of the D/A converter can be minimized.

However, since the potential variation ($V_{ref}$), between which the potential transits, is very large, a large influence occurs due to clock jitters $t_{j0}$ as shown in FIG. 21.

The clock jitters affect the output property considerably. Especially, the deterioration of SNR (signal-to-noise ratio) is a significant problem. In order to solve the problem, it is contemplated that a moving average of the intervals between generations of voltage pulses is calculated for correcting the pulse shapes. Although this method can abate the jitter influences, the discrepancy of capabilities of respective elements may affect the accuracy of the analogue waveform, which is output finally, thereby degrading the essential merits by the binary output from PWM and PDM mechanisms.

SUMMARY OF THE INVENTION

It is therefore an object of the present invention to provide a D/A converter utilizing PWM or PDM that can reduce influences of jitters.

According to an aspect of the present invention, a D/A converter comprises a pulse generator for generating PDM pulses in accordance with a digital signal, each of the PDM pulses having a rising stage and a falling stage; and a step former incorporated in the pulse generator for causing at least one of the rising stage and the falling stage of each of the PDM pulses to change stepwise. With such a structure, noises by jitters may be reduced to enhance the SNR in a D/A converter using PDM.

In an embodiment, the step former may make the stepped shape of the PDM pulse in such a manner that the envelope that is tangent to the stepped shape resembles a sine curve. With such a structure, although a data stream to be transmitted is constituted of alternations of bits "zero" and "one," the harmonics of the frequency of the alternations can be reduced.

In another embodiment, the step former makes the stepped shape of the PDM pulse in such a manner that the envelope that is tangent to the stepped shape resembles an exponential curve. With such a structure, although the data stream is converted into pulses, the harmonics of the propagation frequency of the pulses can be reduced, thereby lessening influences of the harmonics on the low-pass filter to which the pulses are supplied.

In an embodiment, the step former may include a plurality of delay elements to which the digital signal is supplied, and a plurality of trigger-signal generators for generating trigger signals, which initiate to change an electric potential forming the pulses stepwise, on the basis of the digital signal and the outputs from the delay elements. With such a structure, it is unnecessary to prepare a high rate clock.

According to another aspect of the present invention, a D/A converter comprises a pulse generator for generating PWM pulses in accordance with a digital signal, each of the PWM pulses having a rising stage and a falling stage; and a step former incorporated in the pulse generator for causing at least one of the rising stage and the falling stage of each of the PWM pulses to change stepwise. With such a structure, noises by jitters may be reduced to enhance the SNR in a D/A converter using PWM.

In an embodiment, the step former may change an electric potential, which forms the pulses, stepwise at the leading and trailing edges of clock pulses supplied to the digital-to-analog converter. With such a structure, the clock frequency necessary for executing PWM may be reduced, so that it is unnecessary to prepare a high rate clock, and high frequency noises may be reduced. In addition, the number of changes in the potential can be increased in one data cycle.

BRIEF DESCRIPTION OF THEE DRAWINGS

With reference to the accompanying drawings, various embodiments of the present invention will be described hereinafter. In the drawings, FIG. 1 is a circuit diagram showing a D/A converter according to a first embodiment of the present invention;

DETAILED DESCRIPTION OF PREFERRED EMBODIMENTS

First Embodiment

Figure 1:
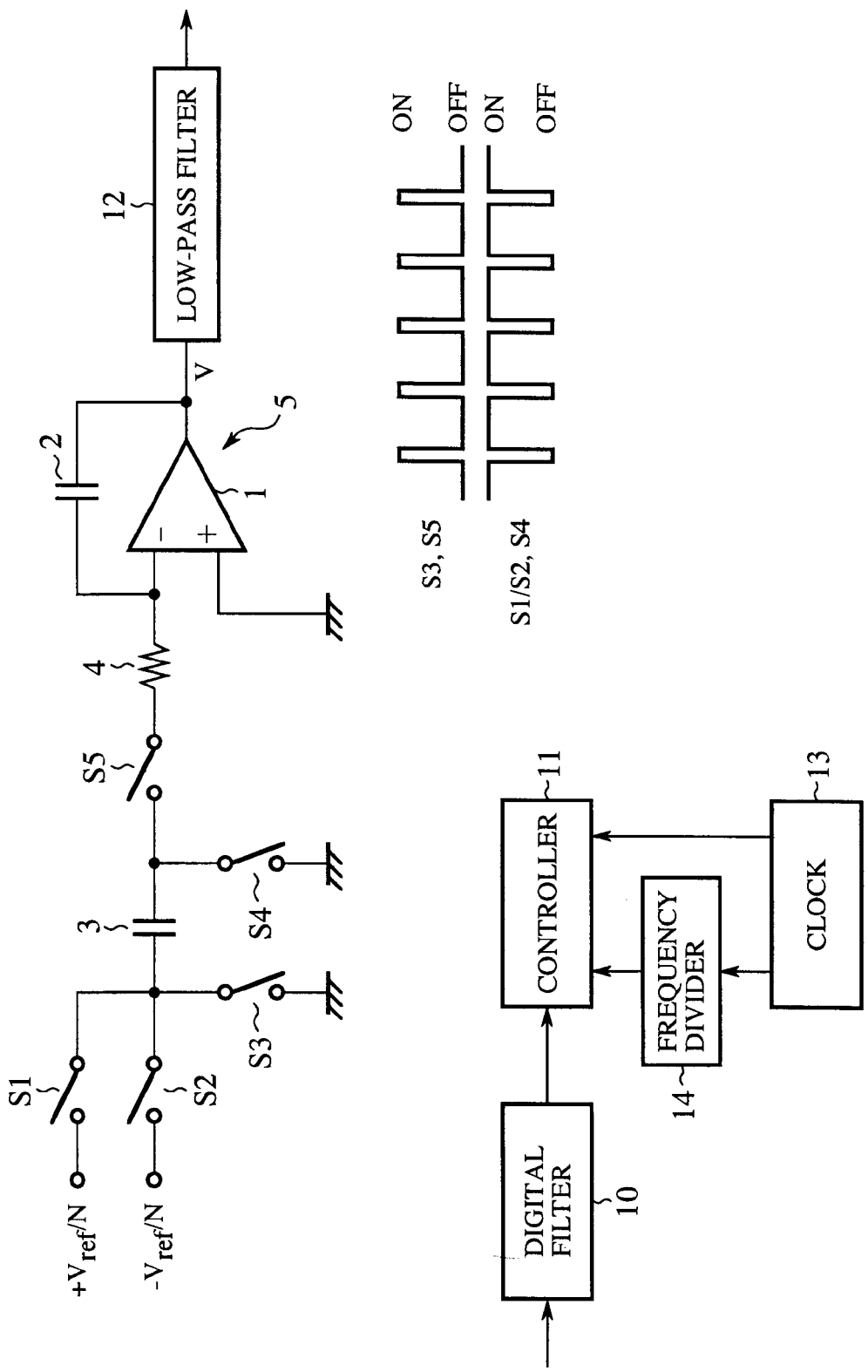

A first embodiment of the present invention relates to a D/A converter that produces PDM pulses. FIG. 1 is a circuit diagram showing a D/A converter according to the first embodiment of the present invention. The D/A converter comprises an operational amplifier 1, a pair of capacitors 2 and 3, a resistor 4, an integrator 5, a digital filter 10, a controller (step former) 11, a low-pass filter 12, a clock 13, a frequency divider 14, switches S1 to S5. The operational amplifier 1, capacitors 2 and 3, the resistor 4, the controller 11, and switches S1 to S5 form up a pulse generator for generating PDM pulses.

The digital filter 10, which is connected with the controller 11, filters digital signals supplied thereto and supplies the filtered digital signals to the controller 11. The clock 13 generates clock pulses and supplies them to the controller 11 and the frequency divider 14. The frequency divider 14 divides the clock pulses given by the clock 13 and supplies the divided clock pulses to the controller 11.

The controller 11 periodically drives the switches S1 to S5 according to the digital signal supplied from the digital filter 10, clock pulses (data clock pulses) directly supplied from the clock 13, and clock pulses (step clock pulses) supplied from the frequency divider 14. The rule for driving the switches will be described later. The controller 11 may comprise a microcomputer, which operates on the basis of a program, as a main constituent. However, the controller 11 may be a circuit constituted of electric elements only. Preferably, the switches S1 to S5 are transistors.

A terminal of the switch S1 is connected to a terminal of a source circuit (not shown) of which the potential is $+V_{ref}/N$ while a terminal of the switch S1 is connected to a terminal of a source circuit (not shown) of which the potential is $-V_{ref}/N$. The potential $V_{ref}/N$ will be described later in detail. A terminal of the switch S3 is grounded. The other terminals of the switches S1, S2, and S3 are connected with a terminal of the capacitor 3 of which the other terminal is connected with a terminal of the switch S5. The intermediate line between the capacitor 3 and the switch S5 is connected with a terminal of the switch S4 of which the other terminal is grounded.

The other terminal of the switch S5 is connected with the resistor 4 that is connected with the inversion input terminal of the operational amplifier 1, of which the non-inversion input terminal is grounded. The capacitor 2 is interposed between the output terminal and the inversion input terminal of the operational amplifier 1. Thus, the operational amplifier 1, the capacitor 2, and the resistor 4 constitute the integrator 5.

The output terminal of the operational amplifier 1 is also connected with the analogue low-pass filter 12. The electric potential V at the output terminal of the operational amplifier 1 varies to present series of pulses. The final output analogue signal can be obtained by filtering the series of pulses through the low-pass filter 12.

Figure 2:
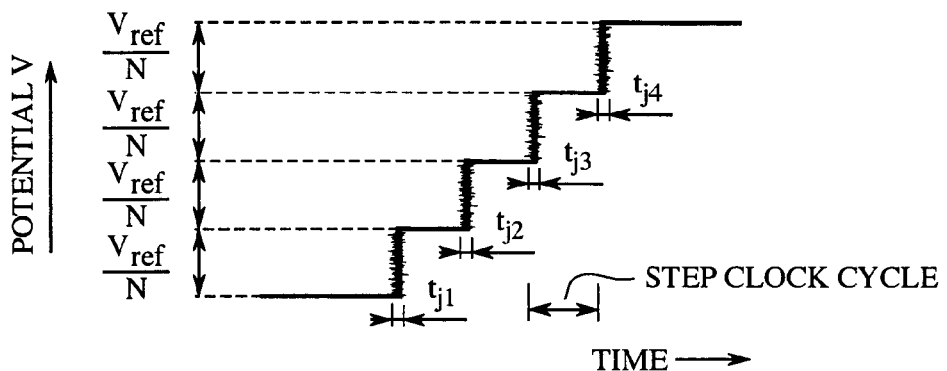
FIG. 2 is a graph showing a step-like change in potential realized by the D/A converter in FIG. 1.

Next, the operation of the D/A converter will be described. The embodiment causes at least one of the rising stage and the falling stage of the potential V to change stepwise. More specifically, the potential V is increased or decreased at the generations (leading edges) of respective step clock pulses by the frequency divider 14, i.e., at the boundaries of step clock cycles as shown in FIG. 2. By virtue of this method, influences by clock jitters can be abated.

Figure 21:
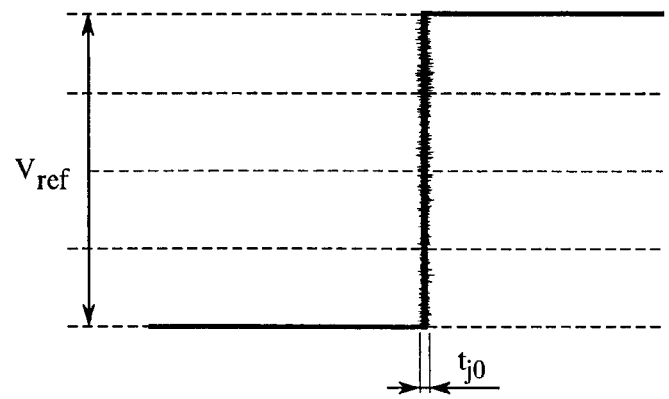
FIG. 21 is an enlarged view showing the leading edge of each pulse shown in FIG. 19 or FIG. 20.

In a conventional output method by a conventional D/A converter, the RMS (root mean square) $E_{j0}$ of noises generated by clock jitters $t_{j0}$ (see FIG. 21) at the leading edges of the clock pulses is represented by formula (1).

$$E_{j0} = V_{ref} t_{jrms} \quad (1)$$

where $V_{ref}$ is the difference between the higher and lower levels of the potential V and $t_{jrms}$ is an RMS of jitters.

However, if the potential V is varied to have N steps of which periods are uniform as shown in FIG. 2 in accordance with the embodiment, the RMS $E_{jk}$ of noises generated by clock jitters $t_{jk}$ per step is represented by formula (2):

$$E_{jk} = \frac{V_{ref} \cdot t_{jk}}{N} \qquad (2)$$

where $t_{jk}$ corresponds to one of $t_{j1}$ through $t_{j5}$ in FIG. 2.

Since a total change of the potential consists of N steps, the RMS $E_{j1}$ of noises generated by clock jitters $t_{jk}$ per total change is represented by formula (3):

$$E_{jl} = \sum_{k=1}^{N} \left[\frac{V_{ref}}{N}\right] \cdot t_{jk} \qquad (3)$$

$$= \frac{V_{ref}}{\sqrt{N}} \cdot \sqrt{\frac{1}{N}\sum_{k=1}^{N} t_{jk}^2}$$

$$= \frac{V_{ref} \cdot t_{jrms}}{\sqrt{N}}$$

$$= \frac{E_{jo}}{\sqrt{N}}$$

Accordingly, $E_{j1}$ is $E_{j0}$ times $N^{1/2}$. Since N is greater than one, $E_{j1}$ is less than $E_{j0}$. Consequently, by virtue of the method according to the embodiment, noises by jitters can be abated, so that SNR may be improved.

Figure 3:
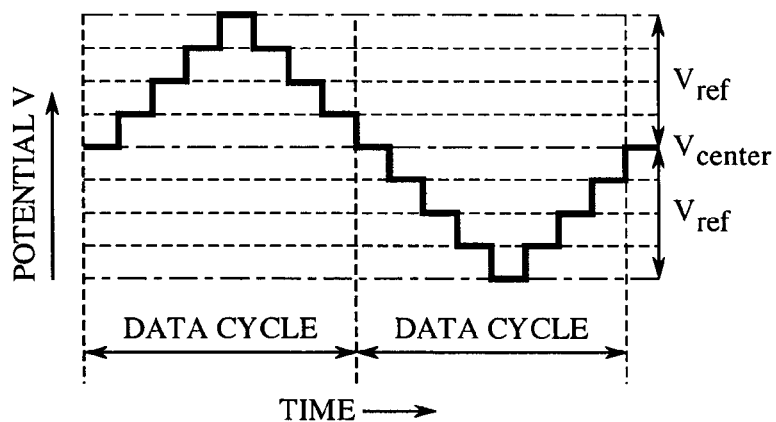
FIG. 3 is a graph showing a step-like change in potential realized by the D/A converter in FIG. 1.

FIG. 3 is a graph showing the change in potential V in accordance with the first embodiment in which the above theory is applied to both increase and decrease of the potential of PDM. In FIG. 3, the earlier data cycle represents bit "one" while the later data cycle represents bit "zero". Since a total change of the potential consists of N steps, one data cycle is 2N times one step clock cycle. Since the step clock cycle is the cycle in which the step clock pulses are provided by the frequency divider 14, the frequency divide ratio of the frequency divider 14 is 2N if the data cycle is the cycle in which the data clock pulses are generated by the clock 13. Both the increment and decrement of the potential V are $V_{ref}/N$ at each step since the increment and decrement can be obtained by dividing the total change $V_{ref}$ of the potential V by N equally. In FIG. 3, N is 4.

In the illustrated embodiment, the number of steps at the increasing stage of the potential V equals to that at the decreasing stage of the potential. However, it is not intended to limit the present invention to the illustrated embodiment. Rather, the number of incremental steps may be different from that of the decremental steps and such a variation is intended to be encompassed in the scope of the present invention.

The controller 11 of the D/A converter shown in FIG. 1 according to the embodiment executes the following operation in order to achieve the above-mentioned change in potential. The controller 11 periodically activates the switches S1 to S5 in accordance with the step clock pulses provided by the frequency divider 14.

More specifically, as shown in the time chart at the bottom of FIG. 1, the controller 11 closes and activates the switches S3 and S5 at the generations (leading edges) of the step clock pulses. After a certain period, the controller 11 opens and deactivates the switches S3 and S5, and closes and activates the switches S1 or S2 and S4. This switching operation is repeated alternately. It should be noted that when the switch S1 is driven to increase the potential, the switch S2 is never driven and continuously opened. On the contrary, when the switch S2 is driven to decrease the potential, the switch S1 is never driven and continuously opened.

Figure 4:
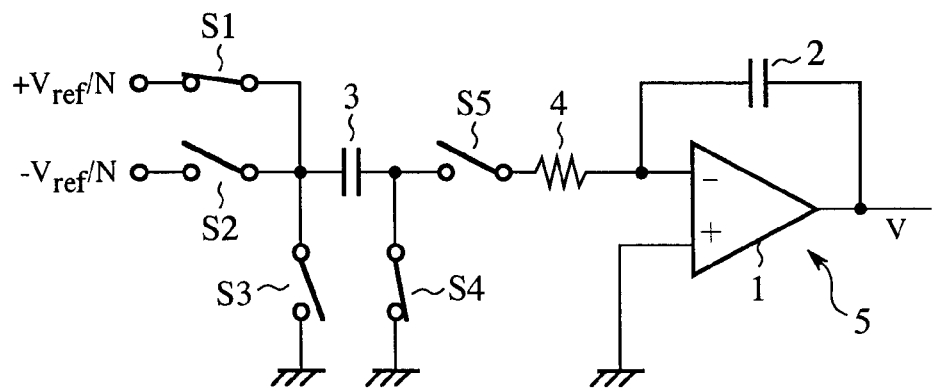
FIG. 4 is a circuit diagram showing a part of the D/A converter in FIG. 1 at an operational stage.

FIG. 4 partially shows the D/A converter in FIG. 1 when the switches S1 and S4 are closed and the other switches are open. In this stage, a potential of $+V_{ref}/N$ is given to a terminal of the capacitor 3 while a potential of the ground level is given to the other terminal of the capacitor 3, so that an electric charge is accumulated in the capacitor 3. On the other hand, the potential V at the output terminal of the operational amplifier 1 in the integrator 5 slowly reduces, but can be considered to be maintained substantially constantly for a short period.

Figure 5:
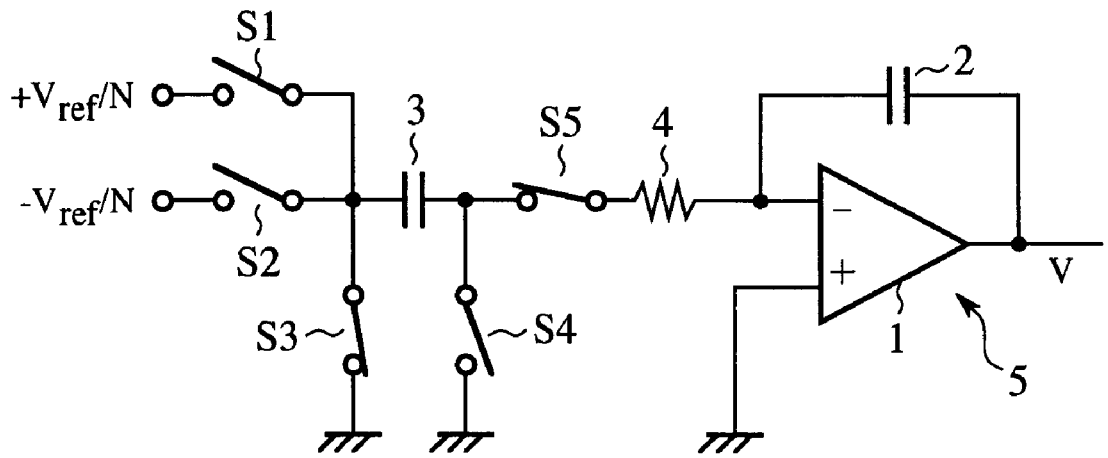
FIG. 5 is a circuit diagram showing a part of the D/A converter in FIG. 1 at another operational stage.

FIG. 5 partially shows the same D/A converter in FIG. 1 when the switches S3 and S5 are closed and the other switches are open. In this stage, the accumulation of the charge in the capacitor 3 is interrupted while the charge moves from the capacitor 3 to the integrator 5. Thus, the potential V at the output terminal of the operational amplifier 1 rises sharply by $V_{ref}/N$.

The stages shown in FIGS. 4 and 5 are repeated alternately, so that the potential V at the output terminal of the operational amplifier 1 changes (rises) stepwise. Accordingly, the controller 11 can achieve the stepped increase of the potential as shown in FIGS. 2 and 3.

The switch S2 is not used at the increase of the potential V but is used at the decrease of the potential V. The operation and advantages of the switch S2 will be clearly understood if the switch S1 is replaced by the switch S2 in the above description in connection with FIGS. 4 and 5. That is to say, when the switches S2 and S4 are closed, a potential of $-V_{ref}/N$ is given to a terminal of the capacitor 3, so that an electric charge is accumulated in the capacitor 3 while the potential V at the output terminal of the operational amplifier 1 is maintained substantially constantly. When the switches S3 and S5 are closed, the potential V at the output terminal of the operational amplifier 1 lowers sharply by $V_{ref}/N$.

In the earlier data cycle in FIG. 3, the switch S1 is driven instead of the switch S2 at earlier N step clock cycles to increase the potential, and the switch S2 is driven instead of the switch S1 at later N step clock cycles to lower the potential. Concerning the later data cycle in FIG. 3, the switch S2 is driven at earlier N step clock cycles in order to lower the potential and then the switch S1 is driven at later N step clock cycles to decrease the potential. Thus, the controller 11 can achieve the stepwise increase and decrease of the potential shown in FIG. 3.

As described above, by virtue of the first embodiment, noises by jitters may be reduced to enhance the SNR in a D/A converter using PDM.

Second Embodiment

Figure 7:
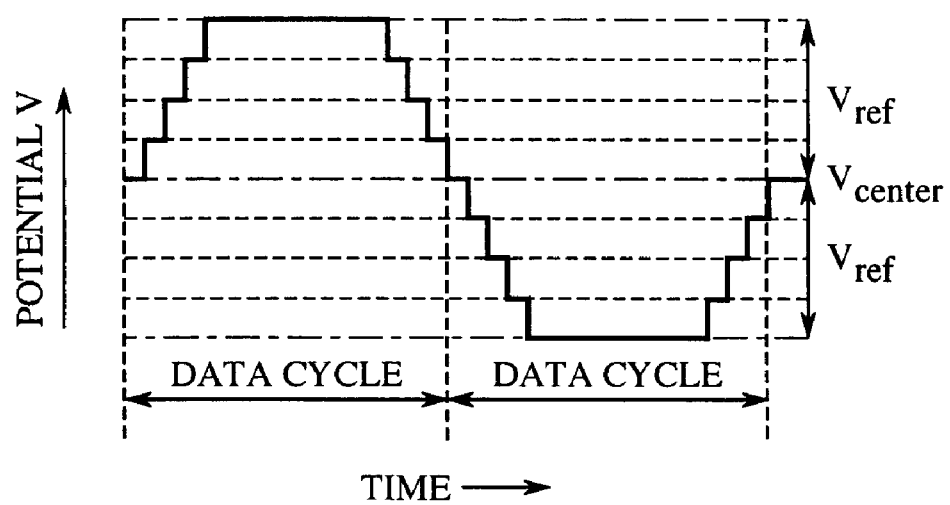
FIG. 7 is a graph showing a step-like change in potential realized by a D/A converter according to a second embodiment of the present invention.

In the first embodiment, as shown in FIG. 3, the maximum or minimum level of potential $+V_{re}$ or $-V_{ref}$ is continued for only one step clock cycle, and then the potential is immediately changed. However, the maximum or minimum level of potential may be continued for a longer duration. FIG. 7 is a graph showing a step-like change in potential V according to a second embodiment of the present invention, which is based on this contemplation. In FIG. 7, the earlier data cycle represents bit "one" while the later data cycle represents bit "zero". The structure of a D/A converter that produces PDM pulses according to the second embodiment may be the same as that of the D/A converter of the first embodiment shown in FIG. 1.

Next, the operation of the D/A converter will be described. As similar to the manner that has been described in conjunction with the first embodiment, the controller 11 repeats the switching operation necessary times, thereby changing the potential V. Once the potential V reaches the maximum level $+V_{ref}$ or the minimum level $-V_{ref}$, the controller 11 continuously opens (turns off) all of the switches S1 to S5 for certain step clock cycles, whereby the potential V at the output terminal of the operational amplifier 1 is maintained substantially constantly. Accordingly, the results shown in FIG. 7 may be obtained. Due to the continuation of the maximum or minimum level of potential, the data cycle is elongated and SNR may be further improved.

As described above, by virtue of the second embodiment, noises by jitters may be reduced to further enhance the SNR.

Third Embodiment

Figure 8:
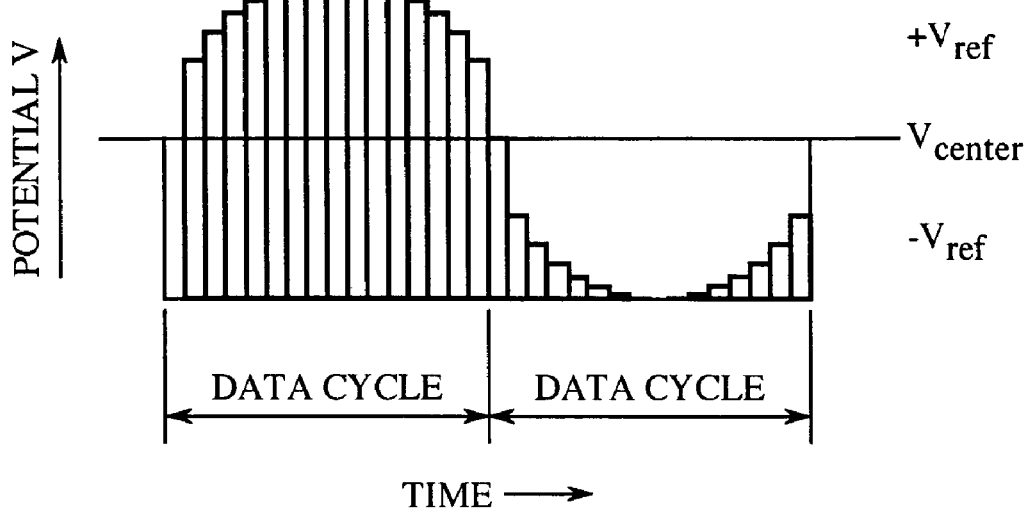
FIG. 8 is a graph showing a step-like change in potential realized by a D/A converter according to a third embodiment of the present invention.

In the first or second embodiment, the increment or decrement of potential at each step is regular, but the increment or decrement can be varied in an alternative embodiment. FIG. 8 is a graph showing a step-like change in potential V according to a third embodiment of the present invention, which is based on this contemplation. In FIG. 8, the earlier data cycle represents bit "one" while the later data cycle represents bit "zero". The locus of the step-like change in potential resembles a sine curve.

Figure 9:
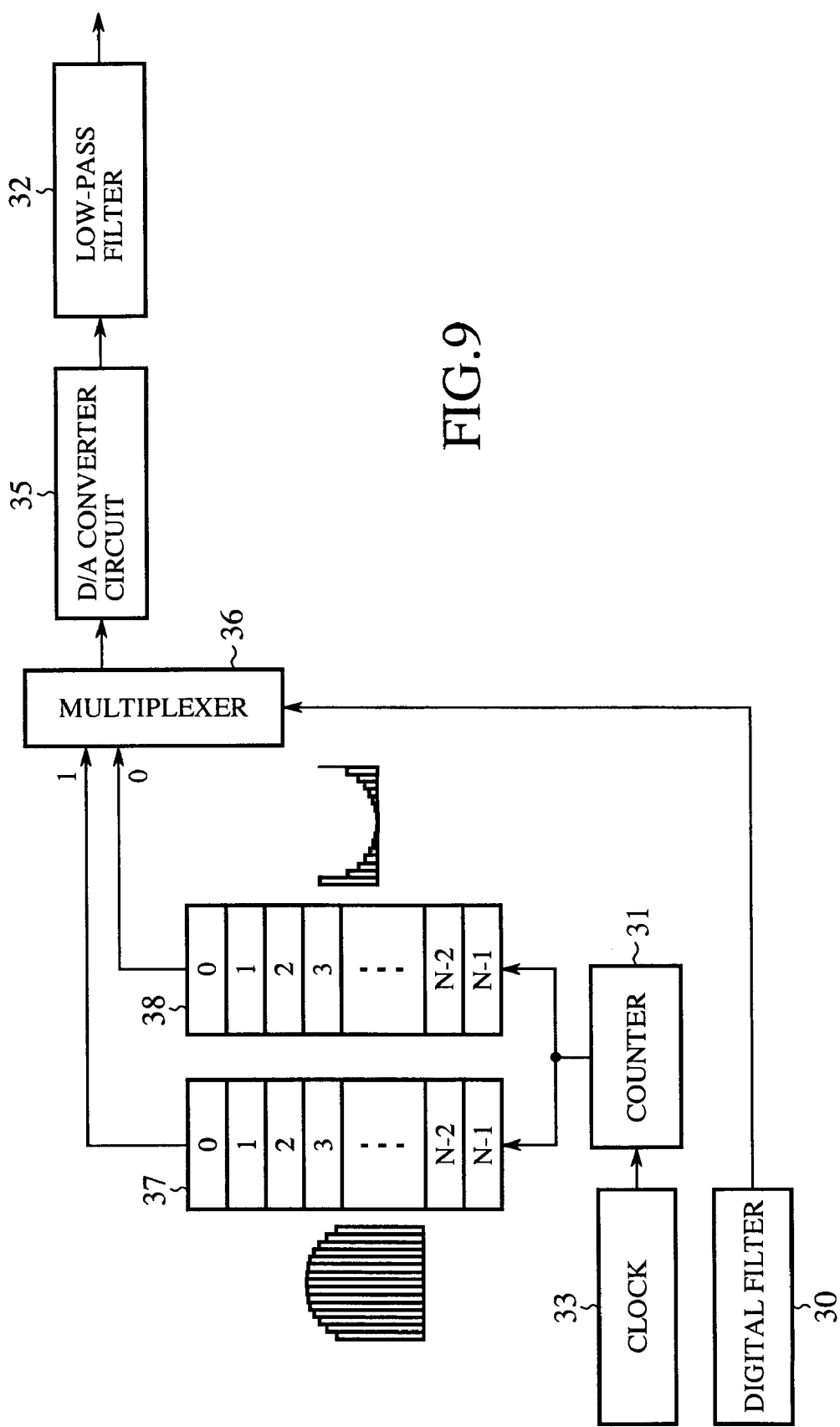
FIG. 9 is a block diagram showing the structure of the D/A converter according to the third embodiment that produces PDM pulses.

FIG. 9 shows the structure of a D/A converter according to the third embodiment that produces PDM pulses. The D/A converter comprises a digital filter 30, a counter 31, a low-pass filter 32, a clock 33, a D/A converter circuit (pulse generator and step former) 35, a multiplexer 36, and two memories 37 and 38.

The D/A converter circuit 35 of the third embodiment is different from the D/A converter of the first and second embodiments, rather, a potential control circuit that outputs a level of potential, depending on indication by an input digital bit.

The memory 37 stores a table corresponding to digital bit "one" while the memory 38 stores a table corresponding to digital bit "zero." In each table, the relationship between elapsed time and target values of the potential that should be output from the D/A converter circuit 35. In other words, a model of change in potential is recorded in each table.

Both memories 37 and 38 are connected with the multiplexer 36, so as to provide the multiplexer 36 with the potential target values recorded in corresponding tables sequentially with the passing of time. The digital filter 30, which is connected with the multiplexer 36, filters a digital signal input thereto and supplies the filtered digital signal to the multiplexer 36. On the basis of a bit contained in the digital signal, the multiplexer 36 selects either of output sequences from the memories 37 and 38.

Next, the operation of the D/A converter will be described. The clock 33 generates step clock pulses and supplies the step clock pulses to the counter 31. Upon receiving a step clock pulse, the counter 31 generates an index for reading tables commonly used by the memories 37 and 38 and supplies the index to the memories 37 and 38. Upon receiving the index, each of the memories 37 and 38 provides the multiplexer 36 with a signal indicating the target value of the potential which should be output from the D/A converter circuit 35. Thus, each of the memories 37 and 38 provides the multiplexer 36 with a sequence representing the model of change in potential in the corresponding table.

On the basis of a bit contained in the digital signal, the multiplexer 36 selects either of output sequences supplied from the memories 37 and 38, and notifies the D/A converter circuit 35 of the target value indicated by the selected output sequence.

For example, if the digital filter 30 supplies bit "one" to the multiplexer 36 (if bit "one" should be represented), the multiplexer 36 selects the sequence from the memory 37 in order to realize the change in potential represented at the earlier data cycle in FIG. 8. Accordingly, the D/A converter circuit 35 changes its output potential, depending on the indication by the table stored in the memory 37.

On the contrary, if the digital filter 30 supplies bit "zero" to the multiplexer 36 (if the bit that should be represented is "zero"), the multiplexer 36 selects the sequence from the memory 38 in order to realize the change in potential represented at the later data cycle in FIG. 8. Accordingly, the D/A converter circuit 35 changes its output potential, depending on the indication by the table stored in the memory 38.

The output terminal of the D/A converter circuit 35 is connected with an analogue low-pass filter 32. The final output analogue signal can be obtained by filtering the series of pulses (output potential from the D/A converter circuit 35) through the low-pass filter 32. Although the output potential from the D/A converter circuit 35 has non-linear components at the rise and fall of the output potential, distortions by the non-linear components do not mix with the output signal, causing no serious inconveniences since the non-linear components generate in the step clock cycle (at regular intervals).

In typical communication, bits "zero" and "one" are sometimes repeated alternatively in transmission of data other than meaningful information. In accordance with the third embodiment, the output pulses from the D/A converter circuit 35 generally form a sine curve, thereby reducing the harmonics of the frequency of the alternations of bits "zero" and "one" in such data transmission.

As described above, by virtue of the third embodiment, noises by jitters may be reduced to further enhance the SNR.

In the third embodiment, the multiplexer 36 selects either of two signal streams from the memories 37 and 38, but it is not intended to limit the present invention to the disclosed embodiment. It is possible to install a similar chip selection function to the integrated element containing the memories 37 and 38. By the chip selection function, the integrated element may appropriately select one of the signal streams from the memories 37 and 38, depending upon a bit in the digital signal.

Fourth Embodiment

Advantageous effects as similar to the third embodiment can be achieved by a fourth embodiment of the present invention that will be described below.

Figure 10:
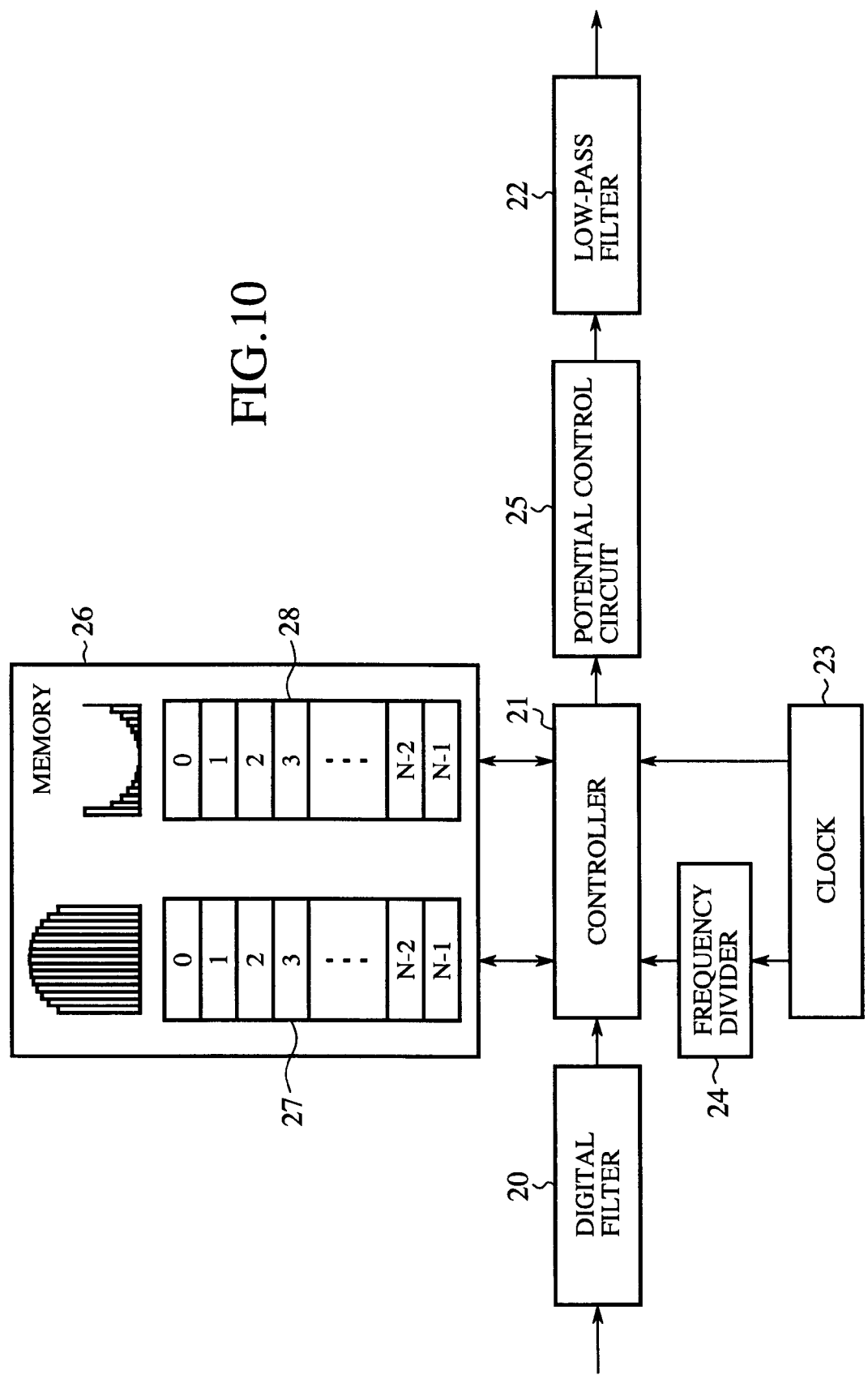
FIG. 10 is a block diagram showing the structure of a D/A converter according to a fourth embodiment that produces PDM pulses.

FIG. 10 shows the structure of a D/A converter according to the fourth embodiment that produces PDM pulses. The D/A converter comprises a digital filter 20, a controller (pulse generator and step former) 21, a low-pass filter 22, a clock 23, a frequency divider 24, a potential control circuit (pulse generator) 25, and a memory 26 storing tables 27 and 28.

Next, the operation of the D/A converter will be described.

The digital filter 20, which is connected with the controller 21, filters digital signals supplied thereto and supplies the filtered digital signals to the controller 21. The clock 23 generates clock pulses and supplies them to the controller 21 and the frequency divider 24. The frequency divider 24 divides the clock pulses given by the clock 23 and supplies the divided clock pulses to the controller 21.

The controller 21 has a counter function and controls the potential control circuit 25 on the basis of the digital signals supplied from the digital filter 20 and in accordance with the clock pulses (data clock pulses) supplied directly from the clock 23 and the clock pulses (step clock pulses) supplied from the frequency divider 24. The controller 21 includes, as a main component thereof, a microcomputer that operates in accordance with a program.

The memory 26 stores two tables 27 and 28. The table 27 corresponds to digital bit "one" while the other table 28 corresponds to digital bit "zero." In each table 27 or 28, stored is the relationship between elapsed time and target values of the potential that should be output from the D/A converter circuit 25. In other words, a model of change in potential is recorded in each table.

For example, if the digital filter 20 supplies bit "one" to the controller 21 (if bit "one" should be represented), the controller 21 reads out the table 27 from the memory 26 in order to realize the change in potential represented at the earlier data cycle in FIG. 8. Then, in order to realize the respective potential target value in the table 27 related to the elapsed time, upon receiving a step clock pulse from the frequency divider 24, the controller 21 controls the potential control circuit 25, so that the potential control circuit 25 changes its output potential, depending on the indication by the table 27.

In contrast, if the digital filter 20 supplies bit "zero" to the controller 21 (if the bit that should be represented is "one"), the controller 21 reads out the table 28 from the memory 26 in order to realize the change in potential represented at the later data cycle in FIG. 8. Then, in order to realize the respective potential target value in the table 28 related to the elapsed time, upon receiving a step clock pulse from the frequency divider 24, the controller 21 controls the potential control circuit 25, so that the potential control circuit 25 changes its output potential, depending on the indication by the table 28.

The output terminal of the potential control circuit 25 is connected with the analogue low-pass filter 22. The final output analogue signal can be obtained by filtering the series of pulses (output potential from the potential control circuit 25) through the low-pass filter 22.

As described above, by virtue of the fourth embodiment, similar advantages as the third embodiment can be accomplished.

Fifth Embodiment

Figure 11:
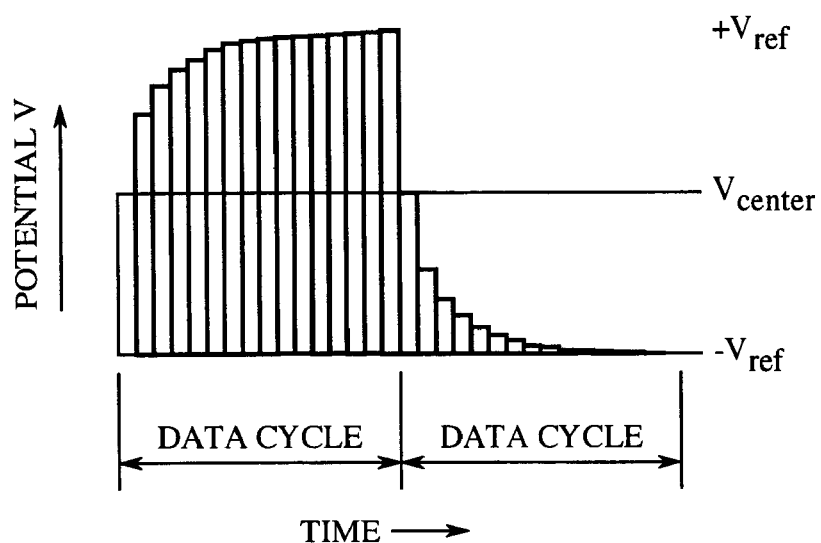
FIG. 11 is a graph showing a step-like change in potential realized by a D/A converter according to a fifth embodiment of the present invention.

FIG. 11 is a graph showing a step-like change in potential V realized by a D/A converter according to a fifth embodiment of the present invention. The earlier data cycle in FIG. 11 represents digital bit "one" while the later data cycle in FIG. 11 represents digital bit "zero." The locus of the step-like change in potential in each data cycle resembles an exponential curve.

The change in potential of the fifth embodiment illustrated in FIG. 11 can be achieved by both of the D/A converters shown in FIGS. 9 and 10 according to the third and fourth embodiments when the contents of the availed tables are modified.

By virtue of the output method of the fifth embodiment, it is possible to reduce the harmonics of the frequency in data transmission caused by the output pulses from the potential control circuit 25 or the D/A converter circuit 35, thereby abating influences on the low-pass filter 22 or 32 to which the output from the potential control circuit 25 or the D/A converter circuit 35 is supplied.

Sixth Embodiment

A sixth embodiment of the present invention involves a D/A converter that produces PWM pulses. The structure of the D/A converter according to the sixth embodiment of the present invention will not be described in detail since operations of the sixth embodiment may be accomplished by the D/A converter illustrated in FIG. 1.

Next, the operation of the D/A converter will be described. The sixth embodiment also causes at least one of the rising stage and the falling stage of the potential V to change stepwise. More specifically, the potential V is increased or decreased at the generations (leading edges) of respective step clock pulses by the frequency divider 14, i.e., at the boundaries of step clock cycles. By virtue of this method, influences by clock jitters can be abated.

Figure 12:
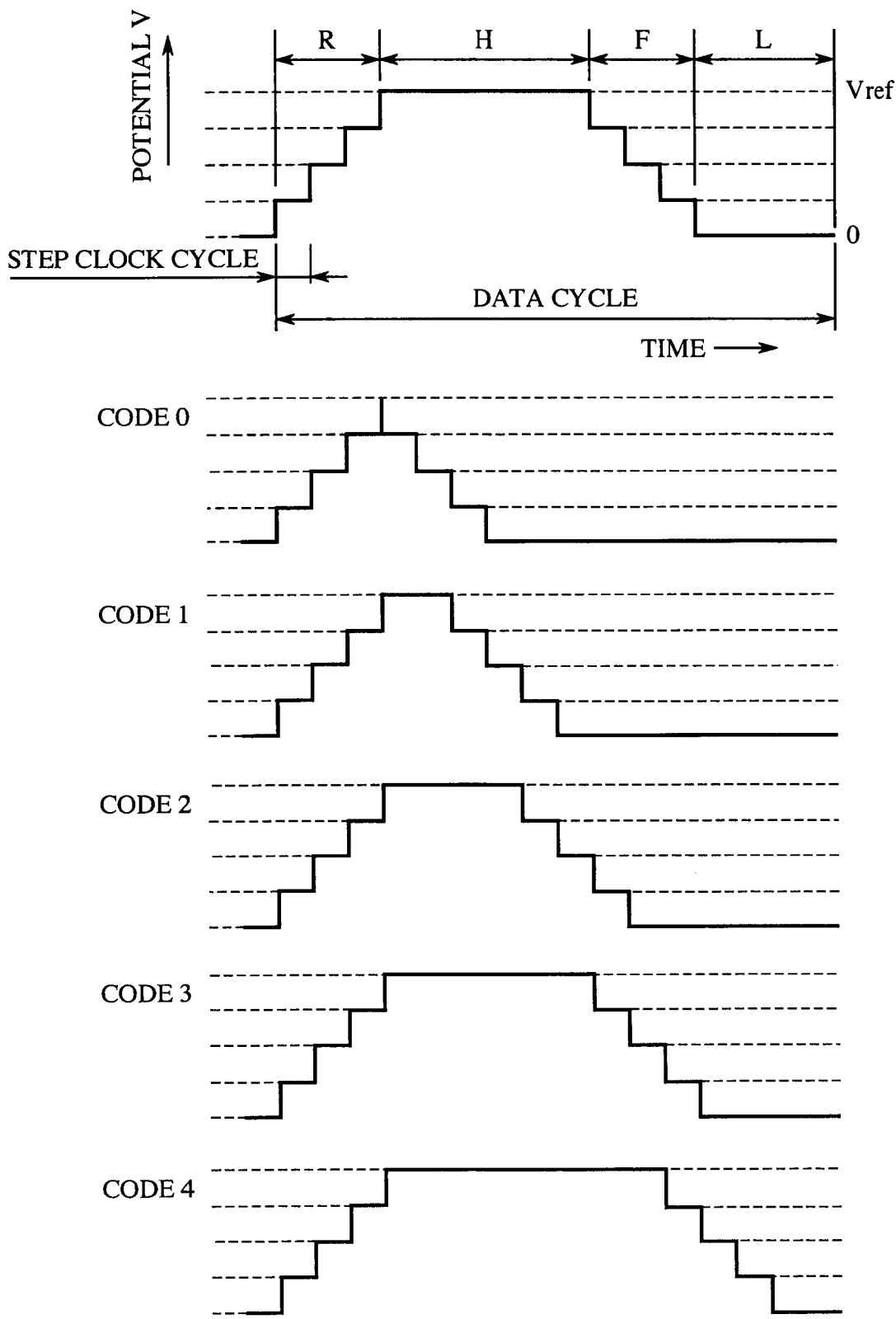
FIG. 12 is a graph showing a step-like change in potential realized by a D/A converter according to a sixth embodiment of the present invention.

FIG. 12 is a graph showing a step-like change in potential realized by a D/A converter according to the sixth embodiment of the present invention, wherein the above-described theory is applied to both increase and decrease of the potential of PWM. In FIG. 12, interval R is an interval wherein the potential V rises, H is an interval (code-representing interval) wherein the potential V stays at the highest level, F is an interval wherein the potential V falls, and L is an interval wherein the potential V stays at the lowest level. In general, the length of the interval wherein the potential is at the highest or lowest level represents a code in PWM. In the embodiment, the length of the interval H wherein the potential is at the highest level represents a code. However, it is not intended to limit the present invention to the disclosed embodiment. Rather, it is possible that the length of the interval wherein the potential is at the lowest level represents a code, and such a variation is intended to be encompassed by the scope of the present invention.

The length of a data cycle is (ri+hi+fa+lo) times the length of one step clock cycle wherein the length of the rising interval R is ri times one step clock cycle, the length of the highest-level interval H is hi times one step clock cycle, the length of the falling interval F is fa times one step clock cycle, and the length of the lowest-level interval L is lo times one step clock cycle. The characteristics of the clock 13 and the frequency divider 14 should meet this relationship.

The value hi corresponding to the length of the highest-level interval H is represented by formulae (4) and (5).

$$hi = k \cdot n \quad (4)$$

where n is the number of the code that should be represented, and k is a constant.

$$hi + lo = c \quad (5)$$

where c is an integer constant and is represented by formula (6).

$$c > n_{max} + 1 \quad (6)$$

where $n_{max}$ is a likely maximum value among the codes that should be represented.

In order to reduce influences by jitters, the theory that has been described in conjunction with the first embodiment is applied to both increase and decrease of the potential. That is, a total increase of the potential consists of (ri+1) steps while a total decrease of the potential consists of (fa+1) steps. In the illustrated embodiment, ri equals to fa, but it is not intended to limit the present invention to the embodiment. Rather, ri may be different from fa, and such a variation is intended to be encompassed by the scope of the present invention.

As to the graph shown in FIG. 12, k=2, ri=fa=3, and c=10. In this case, for example, if the number n of code that should be represented is 2, hi=4 and lo=6. If n=4, hi=8 and lo=2.

On the contrary to the illustrated embodiment, when the length of the lowest-level interval L represents a code, formula (4) is replaced with formula (7) while formulae (5) and (6) are still effective.

$$lo = k \cdot n \quad (7)$$

As described above, by virtue of the sixth embodiment, noises by jitters can be abated, so that SNR may be improved in connection with the D/A converter using PWM.

Seventh Embodiment

It is possible to modify the sixth embodiment to realize a seventh embodiment of the present invention in the manner that will be described below.

In the seventh embodiment, formulae (4) and (6) are replaced by formulae (8) and (9).

$$hi = k \cdot n + l1 \tag{8}$$

where l1 is the number of redundant cycle(s) in the highest-level interval H. The number l1 is an integer that is equal to or greater than one.

$$c > n_{max} + 1 + l1 + l2 \tag{9}$$

where l2 is the number of redundant cycle(s) in the lowest-level interval L. The number l2 is an integer that is equal to or greater than one. Formula (5) is still effective in the sixth embodiment.

Figure 13:
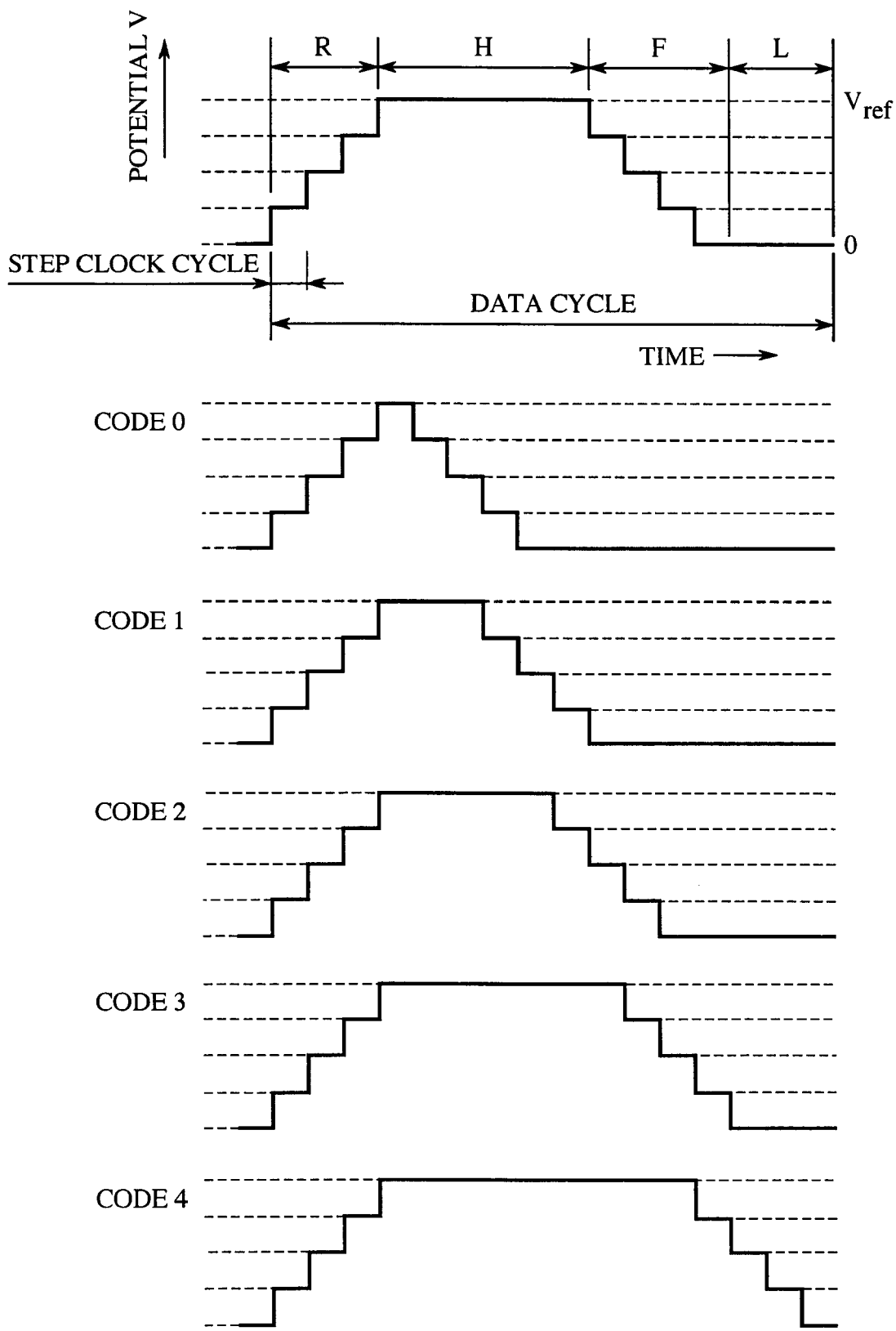
FIG. 13 is a graph showing a step-like change in potential realized by a D/A converter according to a seventh embodiment of the present invention.

In summary, the value hi corresponding to the length of the highest-level interval H of the seventh embodiment is l1 greater than that of the sixth embodiment. In addition, the value lo corresponding to the length of the lowest-level interval L of the seventh embodiment is l2 greater than that of the sixth embodiment. FIG. 13 is a graph showing a step-like change in potential V according to the seventh embodiment of the present invention. In contrast to FIG. 12, the length of the highest-level interval H is not zero although code "zero" is represented in FIG. 13. More exactly, the length of the highest-level interval H is l1 times one step clock cycle when code "zero" is represented.

As shown in FIG. 12, in the sixth embodiment, when code "zero" is represented, a spike of potential occurs. However, as shown in FIG. 13, in the seventh embodiment, although code "zero" is represented, any spike of potential is prevented from occurring.

As described above, by virtue of the seventh embodiment, any spike of potential is prevented from occurring.

Eighth Embodiment

Figure 6:
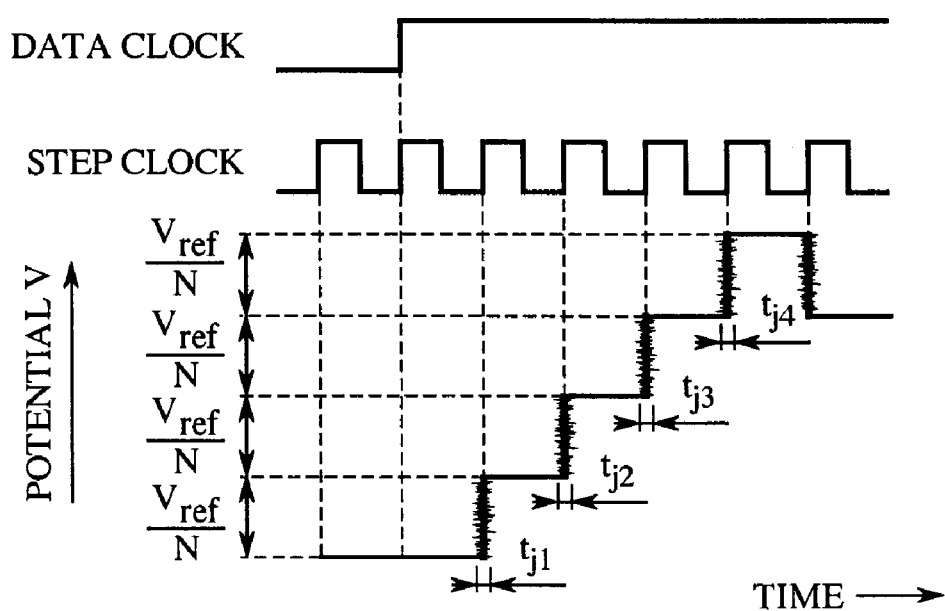
FIG. 6 is a graph showing a step-like change in potential which will be referred for description of an operation of the D/A converter in FIG. 1.

In the above-described embodiments, potential is changed at leading edges of the step clock pulses as shown in FIG. 6. However, it is possible to modify the embodiments to realize an eighth embodiment of the present invention in the manner that will be described below.

Figure 14:
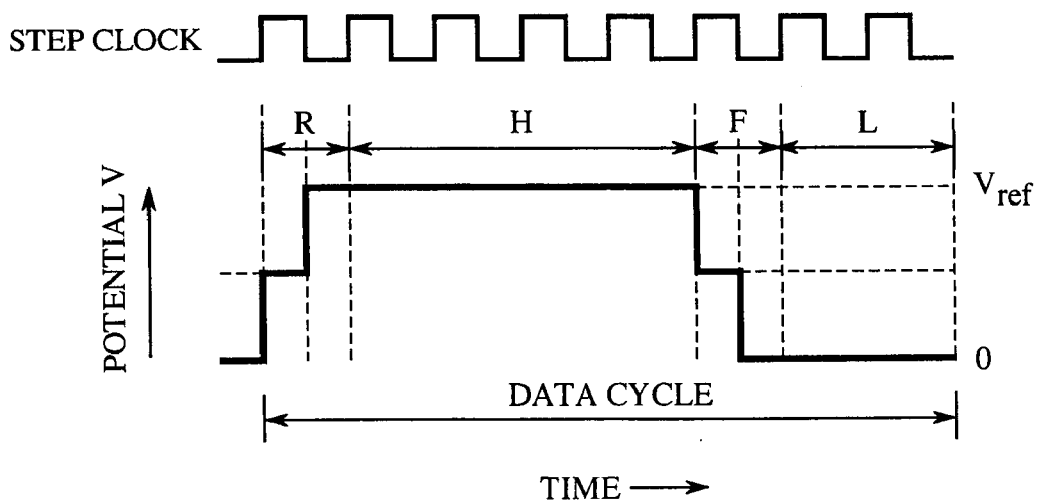
FIG. 14 is a graph showing a step-like change in potential which will be referred for description of an operation of the D/A converter according to an eighth embodiment of the present invention.

In the eighth embodiment, as shown in FIG. 14, potential is changed at not only leading edges but also trailing edges of step clock pulses. Therefore, instead of the cycle of the step clock pulses, a half cycle of the step clock pulses can be utilized as an operational reference.

As described above, by virtue of the eighth embodiment, it is possible to diminish the clock frequency necessary for PWM, thereby excluding the necessity of provision of a high-rate clock, and restraining high frequency noises that may caused by a high-rate clock pulses. From another standpoint, it is possible to multiply the number of change in potential in one data cycle.

The above-described modification may be applied to not only D/A converters using PWM but also D/A converters using PDM. Both variations wherein such a modification is applied are intended to be encompassed by the scope of the present invention.

Ninth Embodiment

In all of the above-described embodiments, clock pulses are utilized for generating the analogue stepped pulse form (change in potential). However, it is possible realize a ninth embodiment of the present invention in the manner that will be described below.

Figure 15:
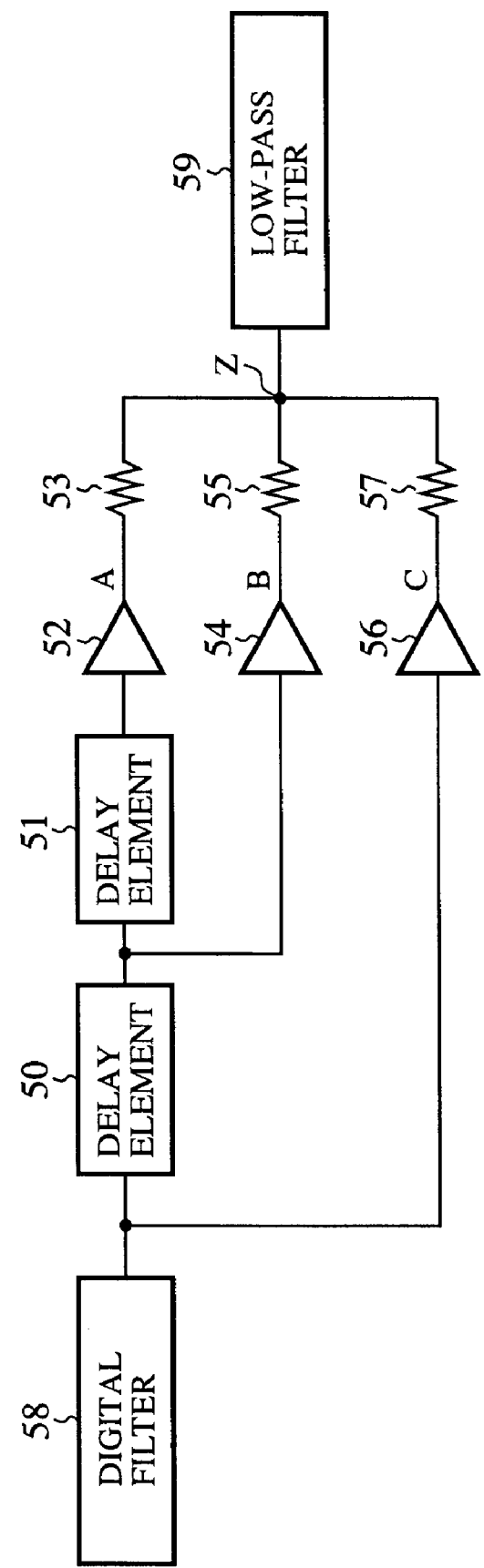
FIG. 15 is a circuit diagram showing the structure of a D/A converter according to a ninth embodiment of the present invention.

FIG. 15 is a circuit diagram showing the structure of a D/A converter according to the ninth embodiment of the present invention. The D/A converter includes two delay elements 50 and 51; three buffers 52, 54, and 56; three resistors 53, 55, and 57; a digital filter 58; and a low-pass filter 59. The delay elements 50 and 51, the buffers 52, 54, and 56, and the resistors 53, 55, and 57 form up a pulse generator and a step former. The buffers 52, 54, and 56 also functions as a trigger-signal generator.

The delay element 50 produces a time delay that does not correlate to that of the delay element 51. The delay elements 50 and 51 are connected in series while the input terminal of the delay element 50 is connected with the digital filter 58 and the output terminal of the delay element 51 is connected with the input terminal of the buffer 52. The output terminal of the buffer 52 is connected with a resistor 53 that is connected with the low-pass filter 59.

The intermediate line between the delay elements 50 and 51 is connected with the input terminal of the buffer 54 while the output terminal of the buffer 54 is connected with a resistor 55 that is also connected with the low-pass filter 59.

The intermediate line between the digital filter 58 and the delay element 50 is connected with the input terminal of the buffer 56 while the output terminal of the buffer 56 is connected with a resistor 57 that is also connected with the low-pass filter 59.

Next, the operation of the D/A converter will be described.

Figure 16:
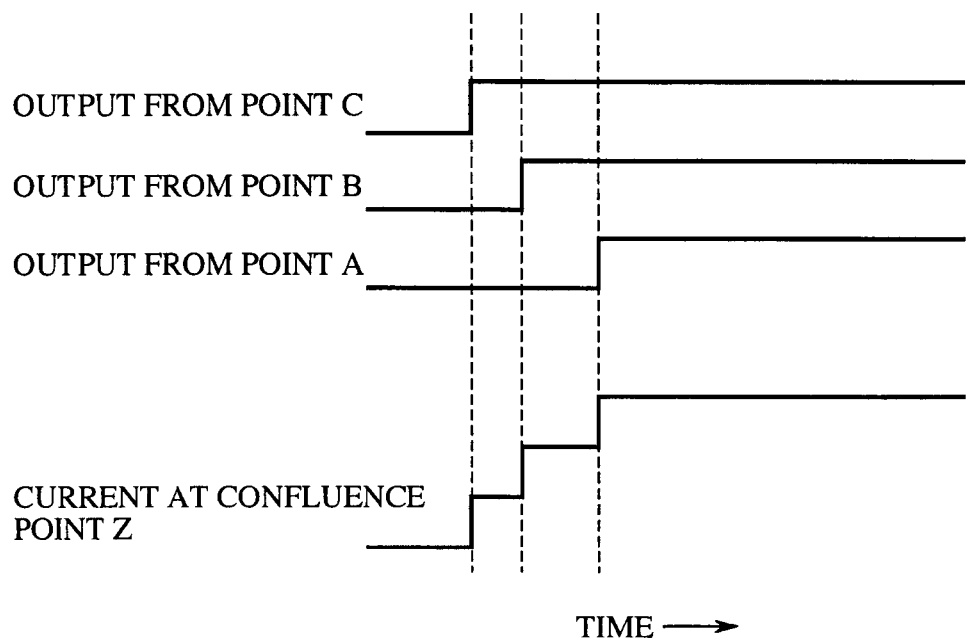
FIG. 16 is a graph showing changes of outputs at various parts in the circuit shown in FIG. 15.

Each of the buffers 52, 54, and 56 outputs a high level current from the output terminal thereof for a certain period once digital bit "one" is supplied to the input terminal thereof. Because of the presence of the delay elements 50 and 51, the output moments of the high level current from point A, B, and C differs from one another. As shown in FIG. 16, the output of the high level current from point B of FIG. 15 lags behind that from point C by the delay characteristics of the delay element 50. Further, the output of the high level current from point A lags behind that from point B by the delay characteristics of the delay element 51. Accordingly, the current at the confluence point Z changes (rises) step-wise. Since the duration of the high level current from the buffers 52, 54, and 56 is uniform, the terminational moments of the current outputs from the buffers 52, 54, and 56 are also different from one another. Accordingly, when the current at the confluence point Z falls, the current also changes step-wise.

It is preferable that each delay element 50 or 51 includes a number of NOT gates connected in series and a number of output taps interposed between adjacent NOT gates although particulars are not illustrated. In such a delay element, different delays occur at the respective output taps. The amount of delay at each output tap can be measured by the use of a known PLL (phase-locked loop) technique. Selecting any one of output taps to be used for outputting signal enables selecting delay of the output signal. In other words, it is possible to adjust the delay optionally in accordance with such delay element.

The illustrated D/A converter in accordance with this embodiment includes two delay elements 50 and 51 and three buffers 52, 54, and 56 for realizing rise and fall of potential constituted of N steps. However, it should be understood that the drawing is used for exemplification only. It will be apparent for those skilled in the art that the number of delay elements and the number of buffers are not limited to the illustrated embodiment.

As described above, the ninth embodiment may exclude the necessity of provision of a high-rate clock and achieve advantages similar to those of above-described other embodiments.

Tenth Embodiment

Figure 17:
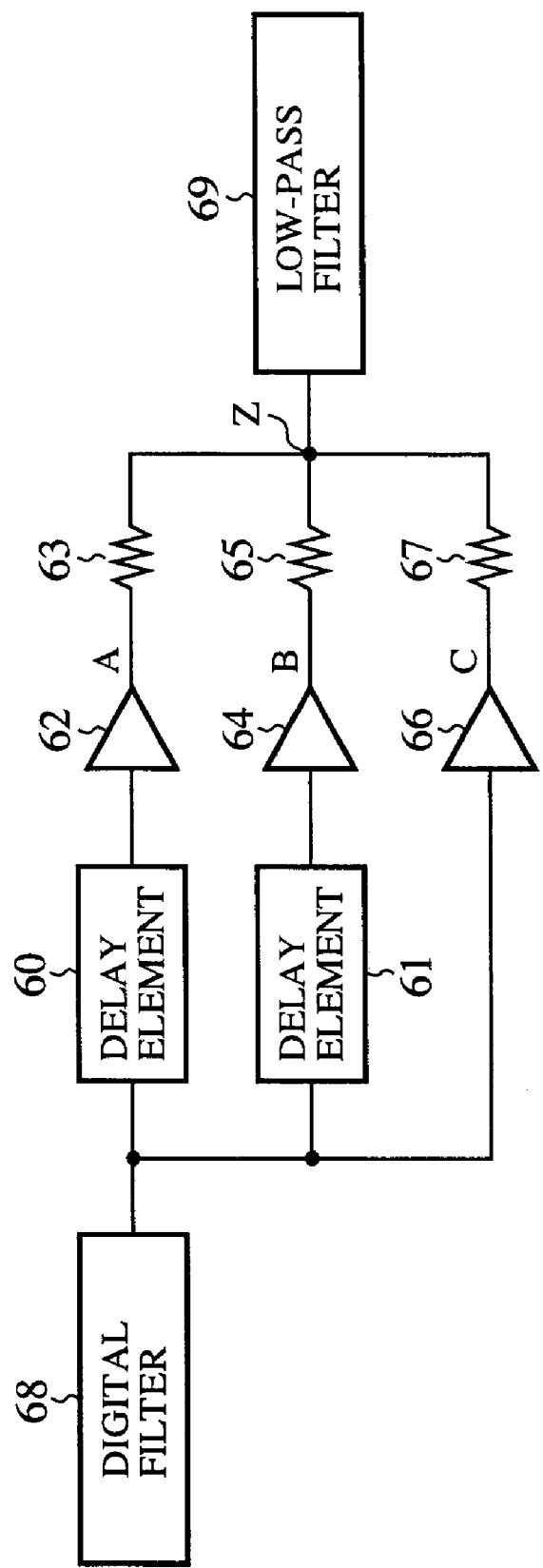
FIG. 17 is a circuit diagram showing the structure of a D/A converter according to a tenth embodiment of the present invention.
Figure 19:
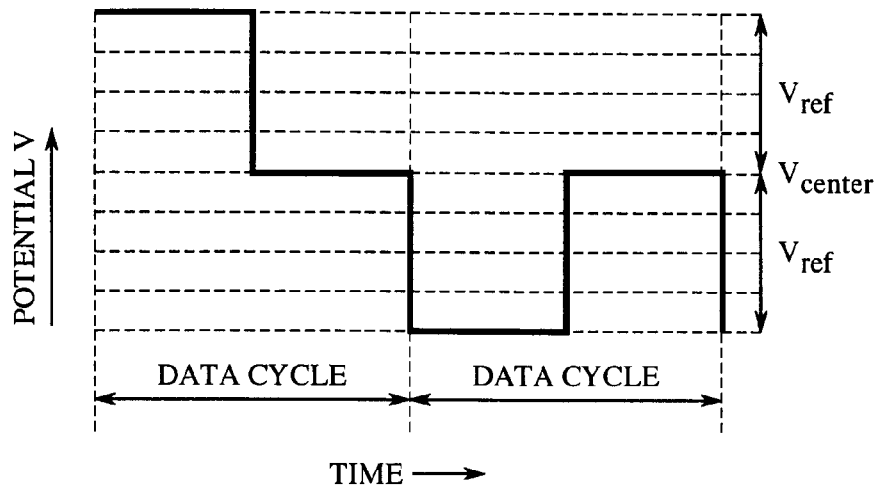
FIG. 19 is a graph showing a change in potential realized by a conventional PDM mechanism.
Figure 20:
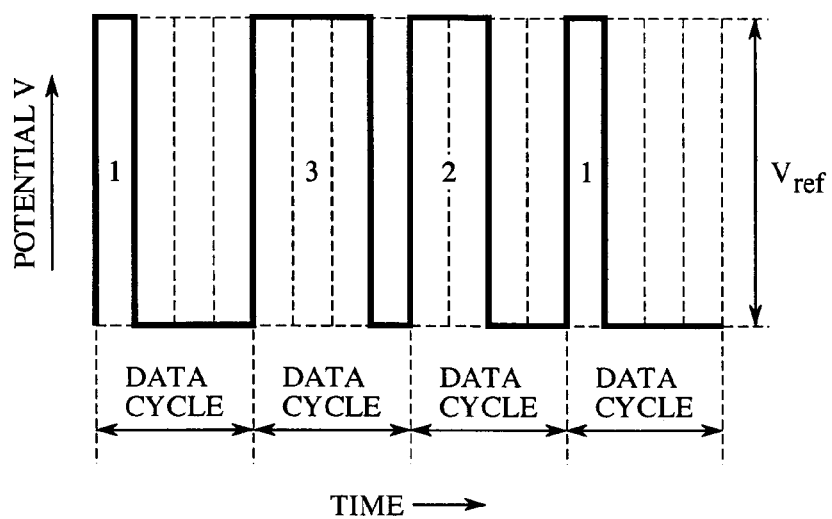
FIG. 20 is a graph showing a change in potential realized by a conventional PWM mechanism.

FIG. 17 is a circuit diagram showing the structure of a D/A converter according to a tenth embodiment of the present invention. The tenth embodiment is a variation of the above-described ninth embodiment. The D/A converter includes two delay elements 60 and 61; three buffers 62, 64, and 66; three resistors 63, 65, and 67; a digital filter 68; and a low-pass filter 69. The delay elements 60 and 61, the buffers 62, 64, and 66, and the resistors 63, 65, and 67 form up a pulse generator and a step former. The buffers 62, 64, and 66 also functions as a trigger-signal generator.

Although the delay elements 60 and 61 are arranged in parallel, the delay element 60 produces a time delay that does not correlate to that of the delay element 61. The output terminal of the delay element 60 is connected with the input terminal of the buffer 62 of which the output terminal is connected with the resistor 63 connected with the low-pass filter 69.

The output terminal of the delay element 61 is connected with the input terminal of the buffer 64 of which the output terminal is connected with the resistor 65 connected with the low-pass filter 69.

The intermediate line between the digital filter 68 and the delay elements 60 and 61 is connected with the input terminal of the buffer 66 of which the output terminal is connected with the resistor 67 connected with the low-pass filter 69.

Figure 18:
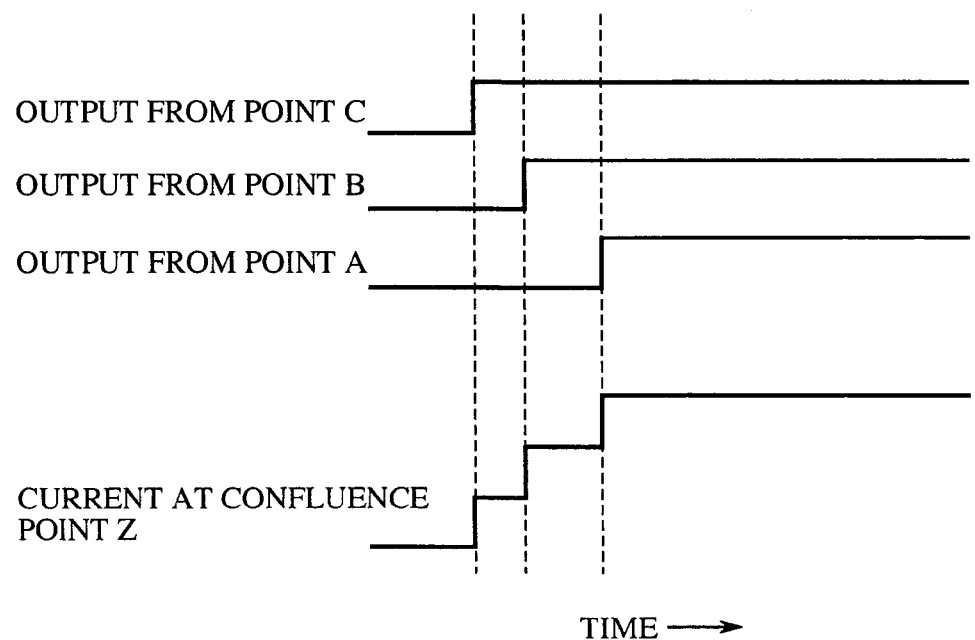
FIG. 18 is a graph showing changes of outputs at various parts in the circuit shown in FIG. 17.

With such a structure, the tenth embodiment may bring the same result as that of the ninth embodiment. As shown in FIG. 18, the output of the high level current from point B of FIG. 17 lags behind that from point C by the delay characteristics of the delay element 60. Further, the output of the high level current from point A lags behind that from point B by the delay characteristics of the delay element 61. Accordingly, the current at the confluence point Z changes (rises) stepwise. Since the duration of the high level current from the buffers 62, 64, and 66 is uniform, the terminational moments of the current outputs from the buffers 62, 64, and 66 are also different from one another. Accordingly, when the current at the confluence point Z falls, the current also changes stepwise.

The delay elements 60 and 61 may be constituted such that the delay amount of each of the delay elements 60 and 61 may be adjusted in accordance with the same manner as that has been described in conjunction with the ninth embodiment.

In accordance with the tenth embodiment, since the delay elements are not arranged in series, jitters by those delay elements are not added to each other. Accordingly, it is possible to further reduce jitters.

As described above, the tenth embodiment may exclude the necessity of provision of a high-rate clock and achieve advantages that are the same as or more excellent than those of above-described other embodiments.

While the present invention has been particularly shown and described with references to preferred embodiments thereof, it will be understood by those skilled in the art that various changes in form and details may be made therein without departing from the spirit and scope of the invention as defined by the claims. Such variations, alterations, and modifications are intended to be encompassed in the scope of the claims.

What is claimed is:

1. A digital-to-analog converter comprising:

a pulse generator for generating PDM pulses in accordance with a digital signal, each of the PDM pulses having a rising stage and a falling stage in a period which is equivalent to a cycle of clock pulses;

a step clock pulse generator for generating a series of step clock pulses that rise and fall in cycles, the step clock pulses having a cycle shorter than the cycle of clock pulses; and a step former incorporated in the pulse generator for causing at least one of the rising stage and the falling stage of each of the PDM pulses to change stepwise at leading edges of respective step clock pulses, wherein at least one of the rising stage and the falling stage of each of the PDM pulses has a plurality of steps.

2. A digital-to-analog converter according to claim 1, wherein the step former makes a stepped shape of the PDM pulse in such a manner that an envelope that is tangent to the stepped shape resembles a sine curve.

3. A digital-to-analog converter according to claim 1, wherein the step former makes a stepped shape of the PDM pulse in such a manner that an envelope that is tangent to the stepped shape resembles an exponential curve.

4. A digital-to-analog converter according to claim 1, wherein the step former includes a plurality of delay elements to which the digital signal is supplied; and a plurality of trigger-signal generators for generating trigger signals, which initiate to change an electric potential forming the pulses stepwise, on the basis of the digital signal and outputs from the delay elements.

5. A digital-to-analog converter comprising:

a pulse generator for generating PWM pulses in accordance with a digital signal, each of the PWM pulses having a rising stage and a falling stage in a period which is equivalent to a cycle of clock pulses;

a step clock pulse generator for generating a series of step clock pulses that rise and fall in cycles, the step clock pulses having a cycle shorter than the cycle of clock pulses; and a step former incorporated in the pulse generator for causing at least one of the rising stage and the falling stage of each of the PWM pulses to change stepwise at leading edges of respective step clock pulses, wherein at least one of the rising stage and the falling stage of each of the PWM pulses has a plurality of steps.

6. A digital-to-analog converter according to claim 5, wherein the step former changes an electric potential, which forms the pulses, stepwise at the leading and trailing edges of the step clock pulses supplied to the digital-to-analog converter.

7. A digital-to-analog converter according to claim 5, wherein the step former includes a plurality of delay elements to which the digital signal is supplied; and a plurality of trigger-signal generators for generating trigger signals, which initiate to change an electric potential forming the pulses stepwise, on the basis of the digital signal and outputs from the delay elements.

* * * * *